(12) United States Patent
Jung

(10) Patent No.: US 7,544,582 B2
(45) Date of Patent: Jun. 9, 2009

(54) SEMICONDUCTOR DEVICE AND METHOD FOR FABRICATING THE SAME

(75) Inventor: Jin Hyo Jung, Bucheon (KR)

(73) Assignee: Dongbu Electronics Co., Ltd. (KR)

( * ) Notice: Subject to any disclaimer, the term of this patent is extended or adjusted under 35 U.S.C. 154(b) by 471 days.

(21) Appl. No.: 11/205,540

(22) Filed: Aug. 16, 2005

(65) Prior Publication Data

US 2006/0040464 A1 Feb. 23, 2006

(30) Foreign Application Priority Data

Aug. 23, 2004 (KR) ............. 10-2004-0066290

(51) Int. Cl.
*H01L 21/76* (2006.01)
(52) U.S. Cl. .................... 438/427; 257/519
(58) Field of Classification Search ............ 438/424, 438/427, 433, 435, 437, 524, 527; 257/350, 257/374, 501, 514, 519
See application file for complete search history.

(56) References Cited

U.S. PATENT DOCUMENTS

| H204 H | * | 2/1987 | Oh et al. ............... 438/433 |
| 6,144,086 A | * | 11/2000 | Brown et al. ............ 257/510 |
| 6,740,954 B2 | | 5/2004 | Lee |
| 6,967,316 B2 | * | 11/2005 | Lee ..................... 250/208.1 |
| 6,979,628 B2 | * | 12/2005 | Kim et al. .............. 438/427 |

FOREIGN PATENT DOCUMENTS

| KR | 2001-0004450 | 1/2001 |
| KR | 10-0327348 | 2/2002 |

OTHER PUBLICATIONS

Jae Kyu Lee: Semiconductor Capable of Decreasing Junction Leakage Current and Narrow Width Effect and Fabricating Method Thereof: Korean Patent Abstracts; Feb. 22, 2002; Publication No. 100327348 B1; Korean Intellectual Property Office, Republic of Korea.
Hyeong Jong Lee; Method for Separating Devices In Semiconductor Devices; Korean Patent Abstracts; Jan. 15, 2001; Publication No. 1020010004450 A; Korean Intellectual Property Office, Republic of Korea.

* cited by examiner

*Primary Examiner*—David Vu
(74) *Attorney, Agent, or Firm*—Andrew D. Fortney; William K. Nelson

(57) ABSTRACT

A semiconductor device and a method for fabricating the same may improve the isolation characteristics without deterioration of the junction diode characteristics and an increase in a threshold voltage of a MOS transistor. The device includes a semiconductor substrate; an STI layer in a predetermined portion of the semiconductor substrate, dividing the semiconductor substrate into an active region and a field region; and a field channel stop ion implantation layer in the semiconductor substrate under the STI layer.

8 Claims, 6 Drawing Sheets

SEMICONDUCTOR DEVICE AND METHOD FOR FABRICATING THE SAME

CROSS-REFERENCE TO RELATED APPLICATIONS

This application claims the benefit of Korean Application No. P2004-66290 filed on Aug. 23, 2004, which is hereby incorporated by reference as if fully set forth herein.

BACKGROUND OF THE INVENTION

1. Field of the Invention

The present invention relates to a semiconductor device, and more particularly, to a semiconductor device having improved isolation structures and/or characteristics, and a method for fabricating the same.

2. Discussion of the Related Art

Generally, a semiconductor device comprises a plurality of electrical devices, such as transistors, diodes and capacitors, on a semiconductor substrate. In this case, it is necessary for the semiconductor device to have an electrical device isolation layer. With high integration in the semiconductor device, the size of the electrical devices is scaled below a nano degree. Thus, the device isolation layer should have high isolation characteristics.

Hereinafter, a semiconductor device according to the related art will be described with reference to the accompanying drawings.

FIG. 1 is a cross sectional view of an isolation structure in a semiconductor device according to the related art.

As shown in FIG. 1, a p-type well 12 and an n-type well 13 are formed at a predetermined depth in a semiconductor substrate 11. Also, an STI layer 14 is formed in a predetermined portion of the semiconductor substrate 11. The STI layer 14 helps to electrically isolate the p-type well 12 and the n-type well 13 from each other. Also, the STI layer 14 divides each of the p-type and n-type wells 12 and 13 into an active region and a field region.

In the p-type well 12, a plurality of n-type layers 15 are formed and are isolated from one another at least in part by the STI layers 14. In the n-type well 13, a plurality of p-type layers 16 are formed and are isolated at least in part from one another by the STI layers 14.

In the semiconductor device, various factors such as the depth of the STI layer 14, the width of the STI layer 14, the characteristics of gap-fill oxide layer in the STI layer 14, the lateral slope of the STI layer 14, the p-type well and n-type well doping profile, and the lower doping profile of the STI layer 14 have an effect on the isolation characteristics (that is, the isolation characteristics between the adjacent n-type layers 15, the isolation characteristics between the adjacent p-type layers 16, and the latch-up characteristics between the n-type layer 15 and the p-type layer 16 adjacent to each other). Especially, the lower doping profile of the STI layer 14 has a great effect on the isolation characteristics.

However, in the method for fabricating the semiconductor device according to the related art, the wells and regions are divided primarily by the STI layers 14, which may cause a deterioration in the isolation characteristics. For example, a leakage current may be generated in the semiconductor device. As a result, the operation characteristics of the semiconductor device may deteriorate due to the leakage current.

Although not shown, when forming the p-type well 12 and the n-type well 13 to enhance the isolation characteristics in the semiconductor device, the doping density is increased by implanting field stop ions and channel stop ions into the entire surface of the semiconductor substrate.

As impurity ions are implanted into the entire surface of the semiconductor substrate during field stop ion implantation and channel stop ion implantation, the doping density of the p-type well 12 and the n-type well 13 also increases, which may deteriorate the junction diode characteristics. Thus, as a threshold voltage $V_{th}$ of MOS transistor is rising, it may cause a limit on the increase of the density of the field channel stop ions.

SUMMARY OF THE INVENTION

Accordingly, the present invention is directed to a semiconductor device and a method for fabricating the same that substantially obviates one or more problems due to limitations and/or disadvantages of the related art.

An object of the present invention is to provide a semiconductor device and a method for fabricating the same, to improve the isolation characteristics, avoid deterioration of the junction diode characteristics, and/or avoid the increase of a threshold voltage of the MOS transistor.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device includes a semiconductor substrate; an STI layer in a predetermined portion of the semiconductor substrate, dividing the semiconductor substrate into an active region and a field region; and a field channel stop ion implantation layer in the semiconductor substrate under the STI layer.

In another aspect, a semiconductor device may include a semiconductor substrate; p-type and n-type wells in the semiconductor substrate; an STI layer in a predetermined portion of the semiconductor substrate, separating the p-type and n-type wells and dividing the substrate into an active region and a field region; a first field channel stop ion implantation layer in the p-type well under the STI layer; a second field channel stop ion implantation layer in the n-type well under the STI layer; n-type impurity ion areas in the active region of the p-type well; and p-type impurity ion areas in the active region of the n-type well.

In another aspect, a method for fabricating a semiconductor device includes implanting ions at a predetermined depth in a semiconductor substrate having an insulating mask pattern thereon, to form a field channel stop ion implantation layer; and etching the semiconductor substrate to form a trench and expose the field channel stop ion implantation layer.

In another aspect, a method for fabricating a semiconductor device includes defining active regions and field regions in a semiconductor substrate; forming an insulating pattern on the active regions of the semiconductor substrate; forming spacers at both sides of the insulating pattern; forming a first field channel stop ion implantation layer at a first predetermined depth in the semiconductor substrate using the insulating pattern and the spacers as a mask; forming a second field channel stop ion implantation layer at a second predetermined depth in the semiconductor substrate using the insulating pattern and the spacers as a mask; removing the spacers; etching the semiconductor substrate to form a trench and expose the first and second field channel stop ion implantation layers using the insulating pattern as a mask; forming an STI layer by gap-filling the trench with an STI insulator and planarizing the STI insulator; and forming p-type and n-type wells by respectively implanting impurity ions into different active regions of the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor device and a method for fabricating the same according to the present invention will be described with reference to the accompanying drawings.

Figure 1:
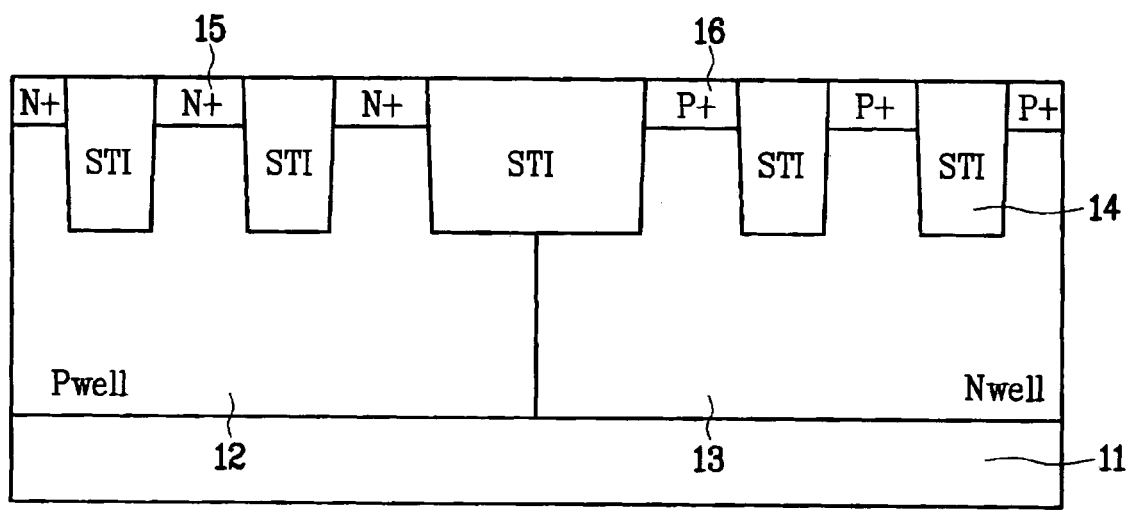
FIG. 1 is a cross sectional view of a semiconductor device according to the related art.
Figure 2:
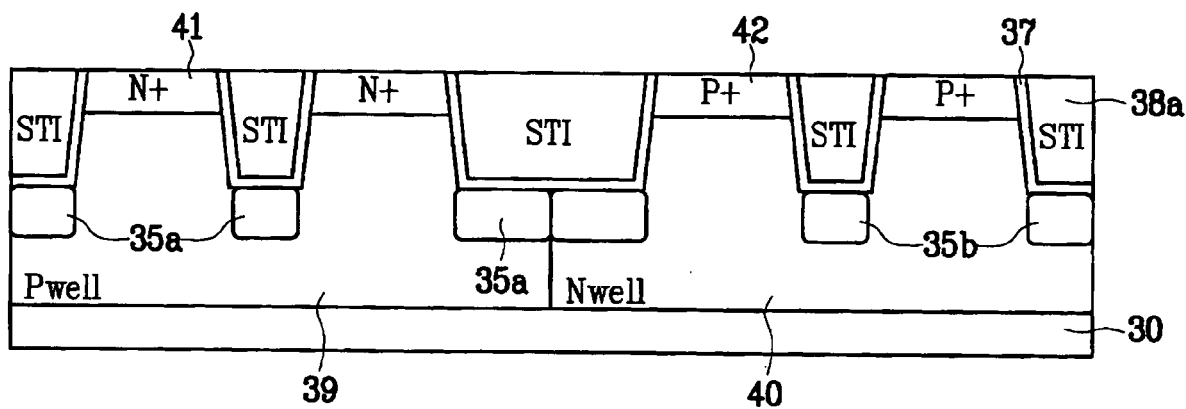
FIG. 2 is a cross sectional view of an exemplary semiconductor device according to the present invention.

FIG. 2 is a cross sectional view of a semiconductor device according to the present invention.

As shown in FIG. 2, the semiconductor device according to the present invention includes a p-type well 39, an n-type well 40, an STI (Shallow Trench Isolation) layer 38a, a first field channel stop ion implantation layer 35a, a second field channel stop ion implantation layer 35b, a heavily-doped n-type impurity ion layer 41, and a heavily-doped n-type impurity ion layer 42.

At this time, the p-type well 39 and the n-type well 40 are formed at a predetermined depth in a semiconductor substrate 30. The predetermined depth for the p-type well 39 may be the same as or different from the predetermined depth for the n-type well 40, but preferably, it is about the same. The STI layer 38a is generally between the p-type well 39 and the n-type well 40, and also divides each well 30 and 40 into one or more active regions and one or more field regions (alternatively, the p-type well 39 and the n-type well 40 are formed between and/or below STI structures 38a, and/or one or more active regions and one or more field regions may be defined by STI layer 38a in a given p-type well 39 or n-type well 40). Then, the first field channel stop ion implantation layer 35a is generally formed in a part of the p-type well 39 under the STI layer 38a. The second field channel stop ion implantation layer 35b is generally formed in a part of the n-type well 40 under the STI layer 38a. The heavily-doped n-type impurity ion layer 41 is formed in the active region of the p-type well 39. The heavily-doped p-type impurity ion layer 42 is formed in the active region of the n-type well 40.

The first field channel stop ion implantation layer 35a may be doped with a p-type dopant comprising boron (B) and/or indium (In), and the second field channel stop ion implantation layer 35b may be doped with an n-type dopant comprising phosphorous (P), arsenic (As) and/or antimony (Sb).

As the first and second field channel stop ion implantation layers 35a and 35b are formed under the STI layers 38a (e.g., in a field region), rather than in an active region, it is possible to enhance the isolation characteristics without deterioration of junction diode characteristics and/or an increase in the threshold voltage of a MOS transistor.

A method for fabricating the semiconductor device according to the present invention will be described as follows.

FIG. 3A to FIG. 3I are cross sectional views of the process for fabricating the semiconductor device according to the present invention.

Figure 3A:
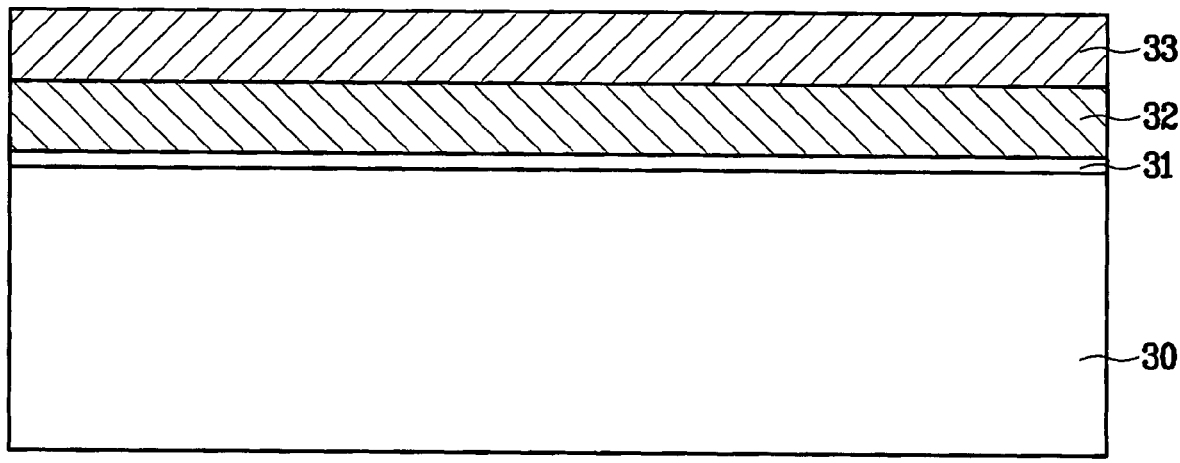
FIG. 3A to FIG. 3I are cross sectional views of an exemplary process for fabricating a semiconductor device according to the present invention.

As shown in FIG. 3A, a pad oxide layer 31 is formed (generally by depositing [e.g., by chemical vapor depositing, or CVD] or thermally growing silicon oxide [e.g., wet or dry thermal oxidation]). The pad oxide layer 31 may have a thickness of from 300 Å to 500 Å. Then, a nitride layer 32 is formed (generally by depositing [e.g., by CVD] silicon nitride). The nitride layer 32 may have a thickness of from 500 Å to 3000 Å. Then, a hard mask oxide layer 33 is formed (generally by CVD) having a thickness of from 500 Å to 5000 Å. The pad oxide layer 31, nitride layer 32, and hard mask oxide layer 33 are generally formed on the semiconductor substrate 30 in sequence. At this time, it is possible to omit the hard mask oxide layer 33 since the hard mask oxide layer 33 generally prevents the nitride layer 32 from being etched in an STI etching process and/or reduces the generation of particles from a subsequent nitride etching step (to form an opening for subsequent pad oxide and trench etching).

Figure 3B:
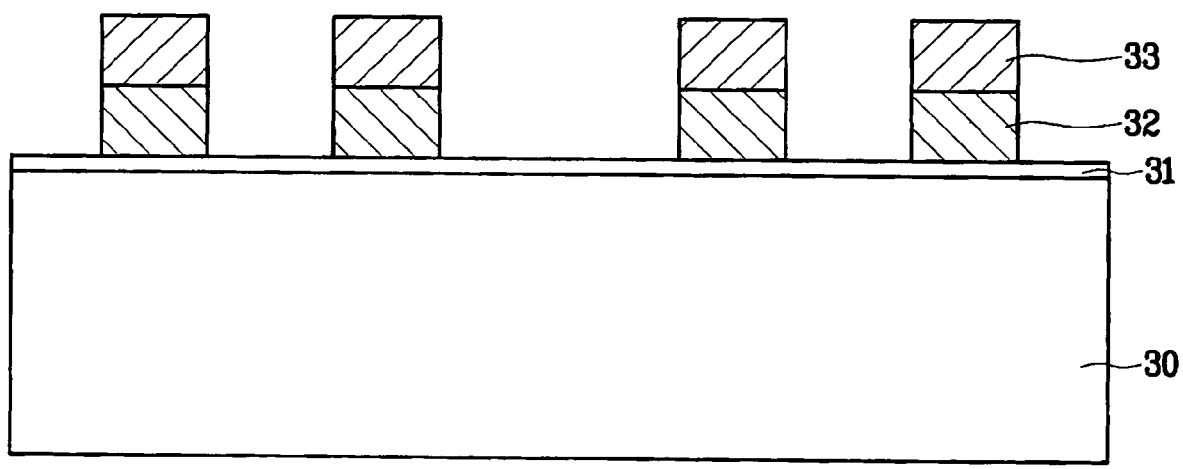

Referring to FIG. 3B, portions of the hard mask oxide layer 33 and the nitride layer 32 are selectively removed by photolithography and etching, whereby the hard mask oxide layer 33 and the nitride layer 32 remain on the active regions and are removed from the field regions and the locations where the STI layers will be formed. That is, the portions on which the nitride layer 32 and the hard mask oxide layer 33 remain correspond to the active regions. Meanwhile, the portions from which the nitride layer 32 and the hard mask oxide layer 33 are removed correspond to the field regions.

Figure 3C:
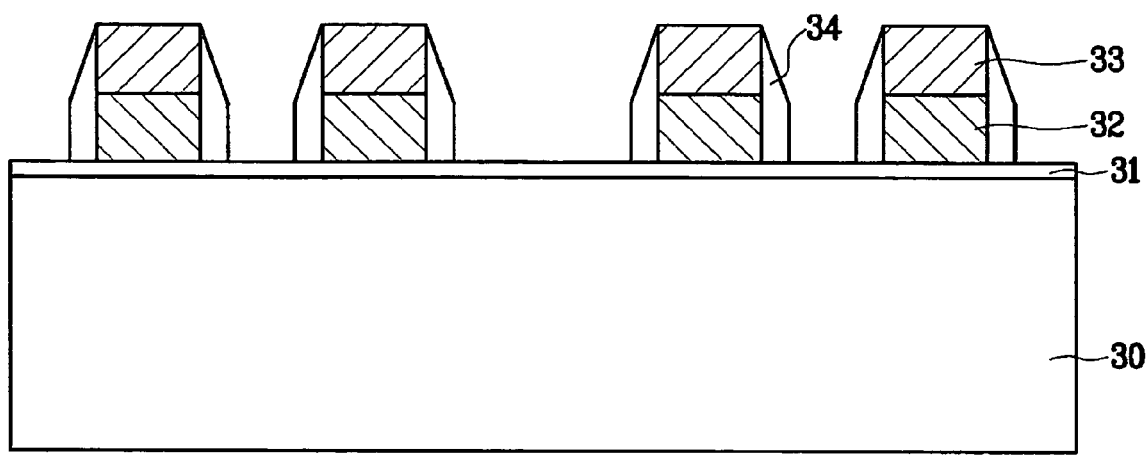

As shown in FIG. 3C, an oxide layer is deposited on the entire surface of the semiconductor substrate 30, and the deposited oxide layer is blanket-etched (e.g., dry etched or anisotropically etched), thereby forming insulating spacers 34 at the sides of the nitride layer 32 and the hard mask oxide layer 33. Other materials may also be used for insulating spacers 34, such as nitride (e.g., silicon nitride), silicon or aluminum oxynitrides, organic materials, etc.

Figure 3D:
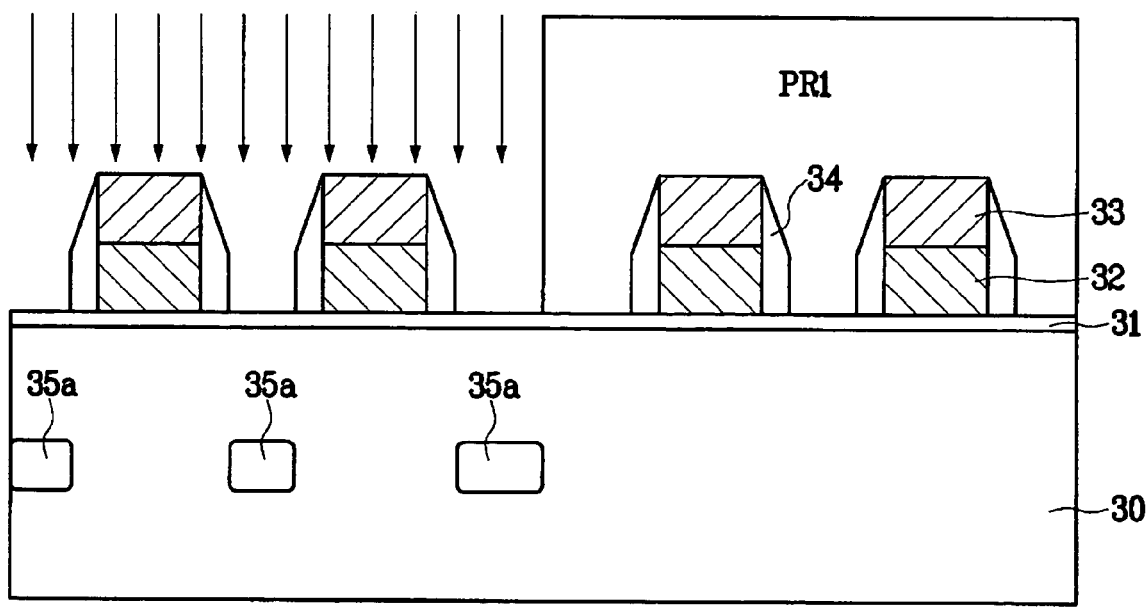

Referring to FIG. 3D, a first photoresist PR1 is coated on the entire surface of the semiconductor substrate 30, and then an exposure and development process is performed on the coated first photoresist PR1, whereby the first photoresist PR1 remains only on or over regions in which the n-type wells will be later formed.

Subsequently, a p-type dopant (e.g., boron [B] and/or indium [In]) is implanted into the semiconductor substrate 30 at a first predetermined depth, thereby forming the first field channel stop ion implantation layer 35a. In this case, the patterned first photoresist PR1 and the exposed hard mask oxide layer 33 and the spacers 34 (i.e., which are not masked by the first photoresist PR1) are used as a mask when implanting the p-type dopant into the semiconductor substrate 30. At this time, the p-type dopant is implanted at a density of $1\times10^{11}$~$1\times10^{15}$ ions/cm$^2$, an energy of 50~2000 KeV, and a tilt angle of 0~7°.

Figure 3E:
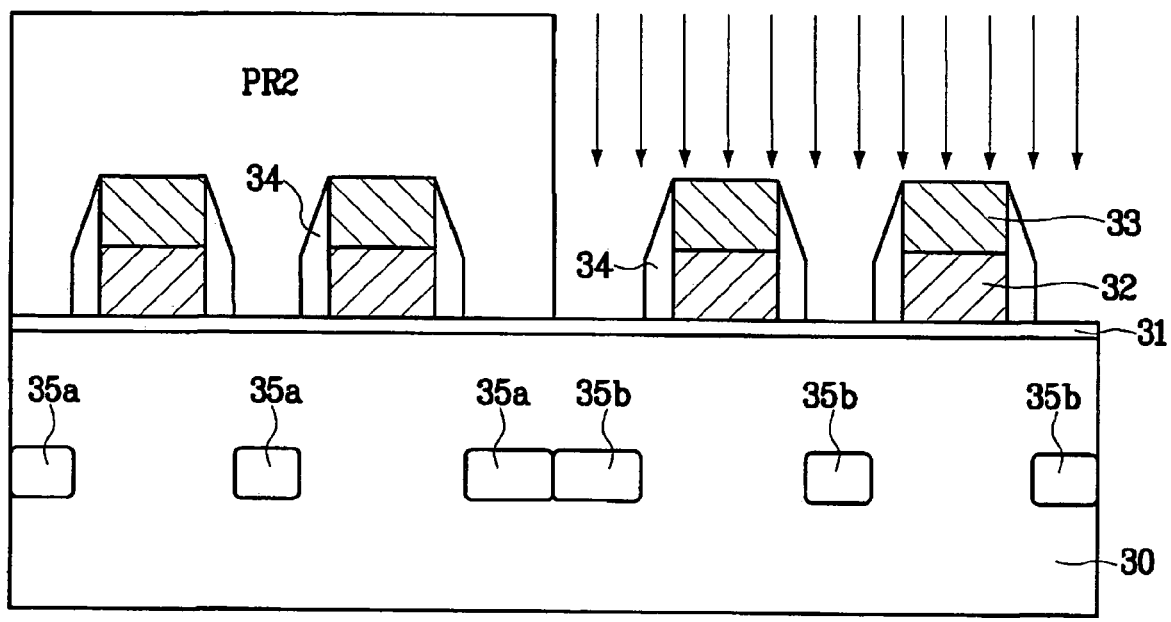

As shown in FIG. 3E, after removing the first photoresist PR1, a second photoresist PR2 is coated on the entire surface of the semiconductor substrate 30. Then, the coated second photoresist PR2 is patterned to remain only on or over regions in which the p-type wells will be later formed. After that, an n-type dopant (e.g., phosphorous [P], arsenic [As] and/or antimony [Sb]) is implanted into the semiconductor substrate 30 at a second predetermined depth, thereby forming the second field channel stop ion implantation layer 35b. As described above, the first and second predetermined depths may be the same or different, but preferably, they are about the same. In this case, the patterned second photoresist PR2 and the exposed hard mask oxide layer 33 and the spacers 34 (i.e., which are not masked by the second photoresist PR2) are used as a mask when implanting the n-type dopant into the semiconductor substrate 30. At this time, the n-type dopant is implanted at a density of $1\times10^{11}$~$1\times10^{15}$ ions/cm$^2$, an energy of 50~2000 KeV, and a tilt angle of 0~7°.

Figure 3F:
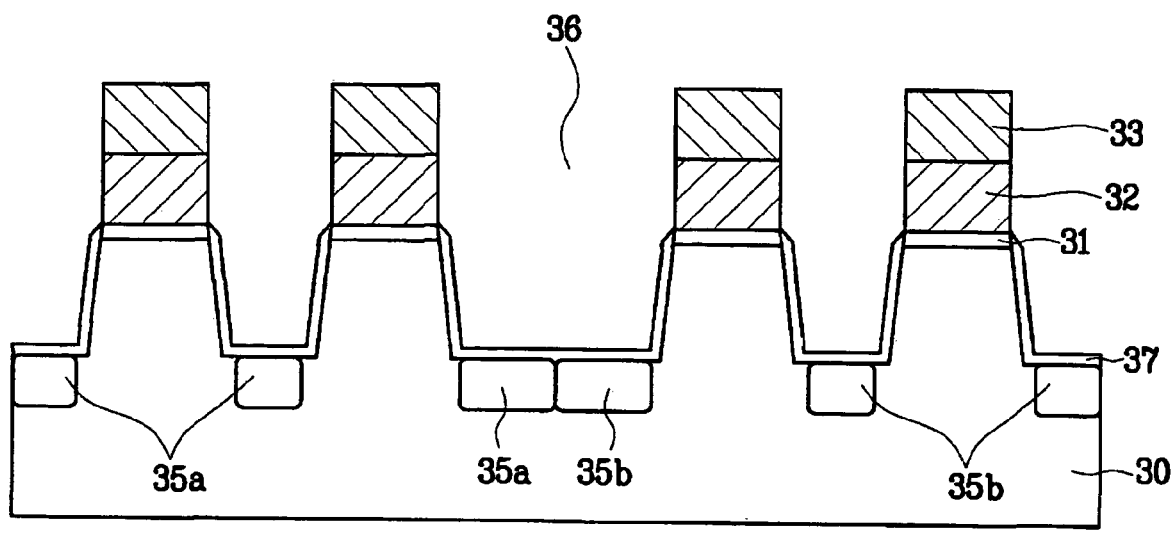

As shown in FIG. 3F, the second photoresist PR2 and the insulating spacers 34 are removed (generally in that order). Then, the semiconductor substrate 30 is etched, generally sufficiently to expose the first and second field channel stop ion implantation layers 35a and 35b, using the oxide layer 33 as a mask, thereby forming a trench 36. Thereafter, a liner oxide layer 37 is formed on the surface of the semiconductor substrate 30 in the trench 36, generally by thermal oxidation (which generally repairs any damage to the semiconductor substrate 30 that may have been caused during the trench etching step).

Figure 3G:
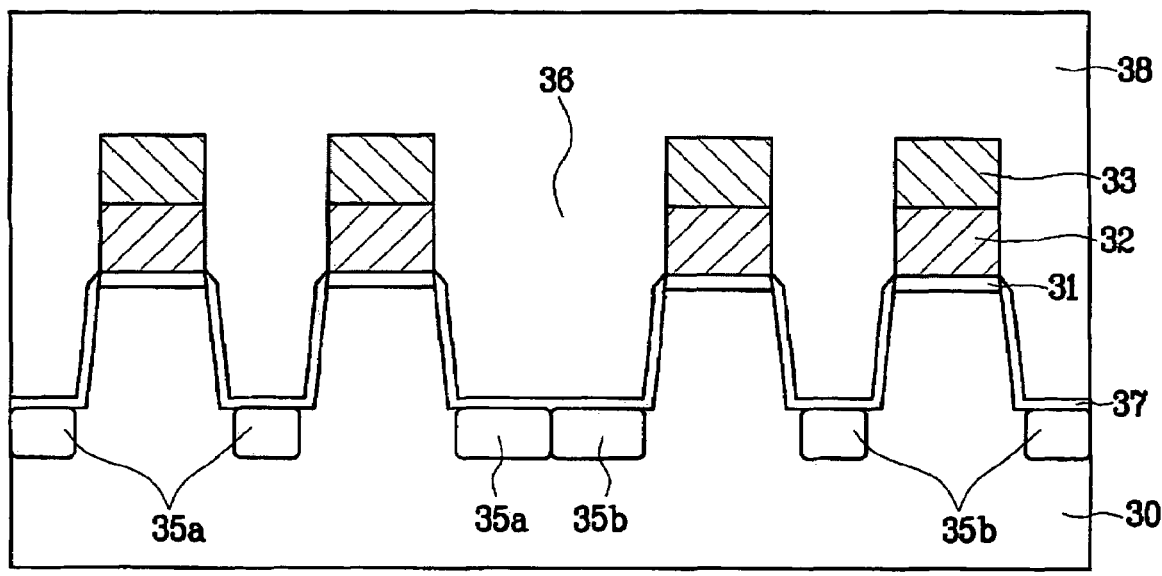

Referring to FIG. 3G, a gap-fill oxide layer 38 is formed (generally by CVD) on the entire surface of the semiconductor substrate to completely fill the trench 36.

Figure 3H:
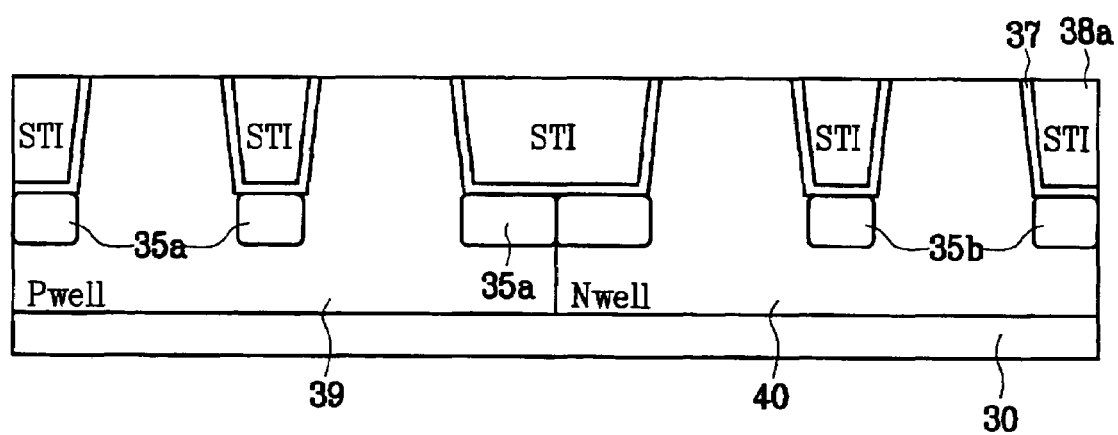

As shown in FIG. 3H, the STI layer 38a is removed from the substrate 30, but kept inside the trench 36, by CMP (Chemical Mechanical Polishing) on the surface of the semiconductor substrate 30. At this time, when performing the CMP process, the gap-fill oxide layer 38, the liner oxide layer 37, the hard mask oxide layer 33, the nitride layer 32 and the pad oxide layer 31 are sequentially removed from the upper side of the substrate 30. In this state, the STI layer 38a is formed, with the gap-fill oxide layer 38 remaining in the trench 34.

Subsequently, a third photoresist pattern (not shown) is formed on the semiconductor substrate 30, wherein the third photoresist pattern has the same pattern or shape as the first photoresist pattern. Then, the p-type well 39 is formed by implanting impurity ions to the semiconductor substrate 30 with the third photoresist pattern (not shown) as a mask.

Also, a fourth photoresist pattern (not shown) is formed on the semiconductor substrate 30, wherein the fourth photoresist pattern has the same pattern or shape as the second photoresist pattern. Then, the n-type well 40 is formed by implanting impurity ions to the semiconductor substrate 30 with the fourth photoresist pattern (not shown) as a mask.

The density of the impurity ions in the first and second field channel stop ion implantation layers 35a and 35b is generally higher than the density of the impurity ions in the p-type well and the n-type well.

Figure 3I:
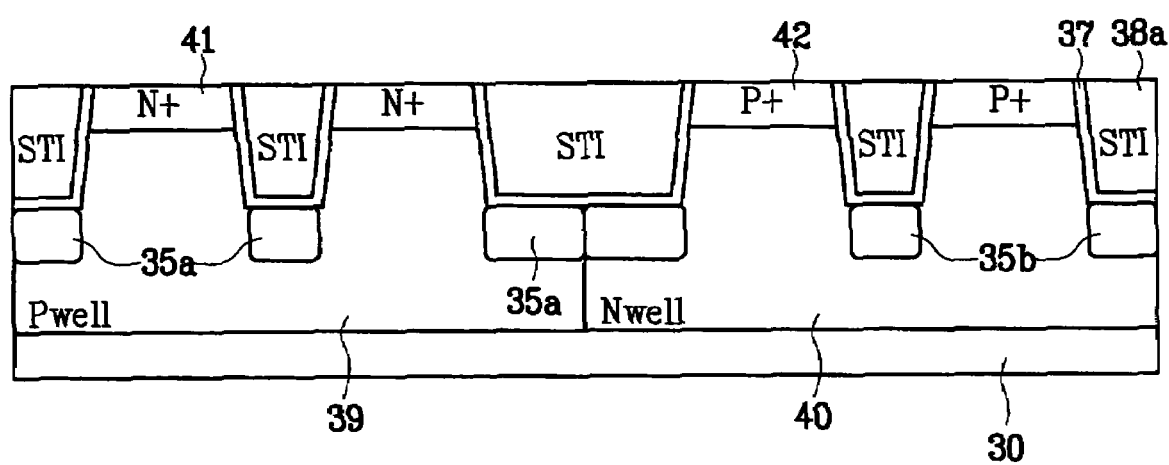

As shown in FIG. 3I, one or more (generally two or more) heavily-doped n-type impurity ion layers 41 are formed in the p-type well 39, and one or more (generally two or more) heavily-doped p-type impurity ion layers 42 are formed in the n-type well 40.

In the CMP process of FIG. 3H, the CMP process is performed such that the surface of the nitride layer 32 is exposed. After that, the nitride layer 32 and the pad oxide layer 31 may be removed by wet or dry etching, rather than further polishing.

As mentioned above, the semiconductor device and the method for fabricating the same according to the present invention has the following advantages.

In the semiconductor device according to the present invention, the first and second field channel stop ion implantation layers are formed under the STI layers, and preferably only under the STI layers (in the field regions, rather than in the active regions). Thus, even though the dopant density of the field channel stop ion implantation layer is higher than that of the well in which it is located, it is possible to reduce or prevent deterioration of junction diode characteristics and an increase in the threshold voltage of a MOS transistor. Accordingly, it is possible to improve the isolation characteristics of the semiconductor device by sufficiently increasing the density of the field channel stop ions.

Also, it is possible to fabricate a high-integration semiconductor device by improving the isolation characteristics.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device comprising:
   defining active regions and field regions in a semiconductor substrate;
   forming an insulating pattern on the active regions of the semiconductor substrate;
   forming spacers at both sides of the insulating pattern;
   forming a first field channel stop ion implantation layer at a first predetermined depth in the semiconductor substrate using the insulating pattern and the spacers as a mask;
   forming a second field channel stop ion implantation layer at a second predetermined depth in the semiconductor substrate using the insulating pattern and the spacers as a mask;
   removing the spacers;
   etching the semiconductor substrate to form a trench and expose the first and second field channel stop ion implantation layers using the insulating pattern as a mask;
   forming an STI layer by gap-filling the trench with an STI insulator and planarizing the STI insulator; and
   forming p-type and n-type wells by respectively implanting impurity ions into different active regions of the substrate.

2. The method as claimed in claim 1, wherein forming the first and second field channel stop ion implantation layers comprises implanting p-type and n-type impurity ions at a density of $1\times10^{11}$~$1\times10^{15}$ ions/cm$^2$ and an energy of 50~2000 KeV, where the p-type impurity ions are implanted to form the first field channel stop ion implantation layer and the n-type impurity ions are implanted to form the second field channel stop ion implantation layer.

3. The method as claimed in claim 2, wherein the densities of the p-type and n-type impurity ions in the respective first and second field channel stop layers are higher than the densities of the impurity ions in the p-type well and the n-type well.

4. The method as claimed in claim 2, wherein the p-type and n-type impurity ions are implanted at a tilt angle of 0°~7°.

5. The method as claimed in claim 1, wherein the first and second field channel stop ion implantation layers are formed in a field region of the substrate.

6. The method as claimed in claim 1, wherein the first predetermined depth is about equal to the second predetermined depth.

7. The method as claimed in claim 1, wherein etching the semiconductor substrate to form the trench and expose the first and second field channel stop ion implantation layers comprises etching a field region of the semiconductor substrate.

8. The method as claimed in claim 1, wherein etching the semiconductor substrate to form the trench and expose the first and second field channel stop ion implantation layers comprises etching a region of the substrate from which the spacers have been removed.

* * * * *